US010290477B2

(12) United States Patent
Gieraltowski et al.

(10) Patent No.: US 10,290,477 B2
(45) Date of Patent: May 14, 2019

(54) MONITORING A DISCHARGE IN A PLASMA PROCESS

(71) Applicant: TRUMPF HUETTINGER SP. Z O.O., Zielonka (PL)

(72) Inventors: Andrzej Gieraltowski, Warsaw (PL); Adam Grabowski, Plonsk (PL); Piotr Lach, Wolomin (PL); Marcin Zelechowski, Warsaw (PL)

(73) Assignee: TRUMPF Huettinger Sp. z o. o., Zielonka (PL)

( * ) Notice: Subject to any disclaimer, the term of this patent is extended or adjusted under 35 U.S.C. 154(b) by 229 days.

(21) Appl. No.: 15/230,017

(22) Filed: Aug. 5, 2016

(65) Prior Publication Data

US 2016/0343549 A1 Nov. 24, 2016

Related U.S. Application Data

(63) Continuation of application No. PCT/EP2015/052490, filed on Feb. 6, 2015.

(30) Foreign Application Priority Data

Feb. 7, 2014 (EP) .................................... 14461506

(51) Int. Cl.
*H01J 37/32* (2006.01)
*G01R 19/165* (2006.01)

(52) U.S. Cl.
CPC ...... *H01J 37/32944* (2013.01); *G01R 19/165* (2013.01); *H01J 37/32128* (2013.01);
(Continued)

(58) Field of Classification Search
None
See application file for complete search history.

(56) References Cited

U.S. PATENT DOCUMENTS

| 4,694,402 A | 9/1987 | McEachern et al. |
| 5,389,154 A | 2/1995 | Hiroshi et al. |

(Continued)

FOREIGN PATENT DOCUMENTS

| CN | 1856859 A | 11/2006 |
| CN | 1987490 A | 6/2007 |

(Continued)

OTHER PUBLICATIONS

Notification of Transmittal of the International Search Report and the Written Opinion of the International Searching Authority for corresponding PCT Application No. PCT/EP2015/052490, dated Mar. 30, 2015, 11 pages.

(Continued)

*Primary Examiner* — Dion Ferguson
*Assistant Examiner* — Srinivas Sathiraju
(74) *Attorney, Agent, or Firm* — Fish & Richardson P.C.

(57) ABSTRACT

Systems and methods of monitoring a discharge in a plasma process are disclosed. The methods include supplying the plasma process with a periodic power supply signal, determining a first signal waveform in a first time interval within a first period of the power supply signal, determining a second signal waveform in a second time interval within a second period of the power supply signal, the second time interval being at a position within the second period corresponding to a position of the first time interval within the first period, comparing the second signal waveform with a reference signal waveform to obtain a first comparison result, determining that the first comparison result corresponds to a given first comparison result, and in response, time-shifting one of the second signal waveform and the reference signal waveform, and comparing the time-shifted signal waveform with the non-time-shifted signal waveform to obtain a second comparison result.

19 Claims, 4 Drawing Sheets

(52) U.S. Cl.
CPC .. *H01J 37/32917* (2013.01); *H01J 37/32926* (2013.01); *H01J 37/32935* (2013.01)

(56) References Cited

U.S. PATENT DOCUMENTS

| | | | |
|---|---|---|---|
| 5,415,757 | A | 5/1995 | Szcrbowski et al. |
| 5,611,899 | A | 3/1997 | Maass |
| 5,698,082 | A | 12/1997 | Teschner et al. |
| 6,420,863 | B1 | 7/2002 | Milde et al. |
| 6,736,944 | B2 | 5/2004 | Buda |
| 7,262,606 | B2 | 8/2007 | Axenbeck et al. |
| 7,292,045 | B2 | 11/2007 | Anwar et al. |
| 7,305,311 | B2 | 12/2007 | van Zyl |
| 7,695,599 | B2 | 4/2010 | Kuriyama et al. |
| 8,456,220 | B2 | 6/2013 | Thome et al. |
| 9,062,377 | B2 * | 6/2015 | Levay .................. H01J 37/241 |
| 9,070,537 | B2 * | 6/2015 | Yuzurihara ....... H01J 37/32082 |
| 9,131,543 | B2 | 9/2015 | Ben-Shmuel et al. |
| 9,167,633 | B2 | 10/2015 | Ben-Shmuel et al. |
| 9,305,751 | B2 | 4/2016 | Kaneko et al. |
| 9,313,870 | B2 * | 4/2016 | Walde ...................... H05H 1/24 |
| 9,613,784 | B2 * | 4/2017 | Klein ................. H01J 37/3444 |
| 9,685,297 | B2 * | 6/2017 | Carter ............... H01J 37/32944 |
| 2002/0195330 | A1 | 12/2002 | Agamohamadi et al. |
| 2005/0051270 | A1 | 3/2005 | Sasaki et al. |
| 2005/0093459 | A1 | 5/2005 | Kishinevsky |
| 2006/0021980 | A1 | 2/2006 | Lee et al. |
| 2006/0049831 | A1 | 3/2006 | Anwar et al. |
| 2006/0137613 | A1 | 6/2006 | Kasai |
| 2006/0213761 | A1 | 9/2006 | Axenbeck et al. |
| 2006/0241879 | A1 | 10/2006 | van Zyl |
| 2007/0073498 | A1 | 3/2007 | Winterhalter et al. |
| 2007/0168143 | A1 | 7/2007 | Axenbeck et al. |
| 2008/0216745 | A1 | 9/2008 | Wiedemuth et al. |
| 2010/0176121 | A1 | 7/2010 | Nobue et al. |
| 2010/0231194 | A1 | 9/2010 | Bauch et al. |
| 2012/0000765 | A1 | 1/2012 | Halloran |
| 2012/0043890 | A1 | 2/2012 | Larson et al. |
| 2012/0146509 | A1 | 6/2012 | Hermanns |
| 2013/0221847 | A1 | 8/2013 | Choi |
| 2015/0048862 | A1 * | 2/2015 | Na ......................... G01R 31/12 324/762.05 |
| 2016/0093471 | A1 * | 3/2016 | McChesney ......... H01J 37/3211 156/345.48 |
| 2016/0237554 | A1 * | 8/2016 | Kadlec ................ H01J 37/3444 |
| 2016/0343549 | A1 * | 11/2016 | Gieraltowski .... H01J 37/32917 |
| 2017/0178879 | A1 * | 6/2017 | Klein ................. H01J 37/3476 |
| 2017/0278665 | A1 * | 9/2017 | Carter ............... H01J 37/32944 |
| 2017/0287684 | A1 * | 10/2017 | Gapinski ........... H01J 37/32944 |
| 2017/0330737 | A1 * | 11/2017 | Zelechowski ....... H01J 37/3476 |

FOREIGN PATENT DOCUMENTS

| | | |
|---|---|---|
| CN | 103474321 A | 12/2013 |
| DE | 4326100 A1 | 2/1995 |
| DE | 4420951 A1 | 12/1995 |
| DE | 19848636 A1 | 5/2000 |
| DE | 102008062949 A1 | 6/2010 |
| DE | 102009011960 A1 | 9/2010 |
| DE | 102013110883 B3 | 1/2015 |
| EP | 1705687 A1 | 9/2006 |
| EP | 1720195 A1 | 11/2006 |
| EP | 1801946 A1 | 6/2007 |
| JP | 2004323902 A | 11/2004 |
| JP | 2004327193 A | 11/2004 |
| JP | 2005-267214 | 9/2005 |
| JP | 2005-268214 | 9/2005 |
| JP | 2007-173244 | 7/2007 |
| JP | 2007-186724 | 7/2007 |
| JP | 2007-186725 | 7/2007 |
| JP | 2007-214254 | 8/2007 |
| JP | 2007-531210 | 11/2007 |
| JP | 2008-206372 | 9/2008 |
| KR | 100483905 B1 | 4/2005 |
| KR | 20110012055 A | 2/2011 |
| TW | 201014148 | 4/2010 |
| TW | 1326462 | 6/2010 |
| WO | WO2008150136 A1 | 12/2008 |
| WO | WO2011073093 A1 | 6/2011 |
| WO | WO2015049213 A1 | 4/2015 |

OTHER PUBLICATIONS

Ochs et al., "Comparisoon of Mid Frequency and Bipolar Pulsed DC Power Supplies for Dual Magnetron Sputtering", Society of Vacuum Coaters, 51st Annual Technical Conference Proceedings, Chicago, IL, Apr. 19-24, 2008, 4 pages.

Wikipedia, "Successive approximation ADC", Creative Commons Attribution-Share-Alike License, last modified on Jul. 6, 2013, 4 pages.

Japanese Notice of Allowance for Japanese Application Serial No. 2016-519776 dated Mar. 26, 2018, 4 pages (with English translation).

Office Action in Taiwan Application No. 103134065, dated Jul. 3, 2018, 20 pages (with English translation).

Office Action in Japanese Application No. 2016-550576, dated Nov. 5, 2018, 11 pages (with English translation).

\* cited by examiner

MONITORING A DISCHARGE IN A PLASMA PROCESS

CROSS-REFERENCE TO RELATED APPLICATIONS

This application is a continuation of and claims priority under 35 U.S.C. § 120 to PCT Application No. PCT/EP2015/052490 filed on Feb. 6, 2015, which claims priority to European Application No. EP 14 461 506.9, filed on Feb. 7, 2014. The contents of both of these priority applications are hereby incorporated by reference in their entireties.

TECHNICAL FIELD

The invention relates to methods, devices, and systems of monitoring a discharge in a plasma process.

BACKGROUND

Coating of substrates, for example glass substrates, by means of cathode sputtering in plasma processes is a well-known process. Cathode sputtering can be performed conventionally or by use of a reactive gas. In the latter case, it is called reactive sputtering. A plasma is generated by means of a current or voltage source, which removes material from a target. The removed material is then deposited on the substrate. Before deposition, the atoms of the target material can combine with gas atoms or molecules in a reactive process.

In reactive processes, medium frequency (MF) generators may be used. Such generators typically operate at frequencies in the range from 10 to 500 kHz. Furthermore, pulsed generators may be used, in particular bipolar pulsed generators. Those generators have in common that they produce a periodic output signal. The periodic output signal is supplied to the plasma process. Typically, the output voltage of such generators is supplied to the plasma chamber by means of two electrodes, which are in turn used as cathode and anode. Both electrodes are connected to a target respectively. The generators may be freely oscillating generators or generators having a controlled frequency.

In particular, if reactive processes are being used, arcs can occur. If arcs occur, they may damage the substrate or the targets. Therefore, arcs should be avoided or, if an arc is detected, it should be quickly extinguished. To be able to extinguish an arc, it is necessary to detect arcs quickly and reliably. To detect arcs, the output signal of the power supply, i.e., a power supply signal, may be observed. In particular, if the output signal changes its value periodically, like in bipolar pulsed or MF plasma processes, the output signal at a specific time in a later period can be compared with a corresponding value at the same time in a previous period. Problems arise, when the output signal rises or falls very quickly. Especially, in bipolar pulse powered plasmas this is very relevant. If this happens, false arcs may be detected, i.e., an apparent arc may be detected even though there is no arc present. This can lead to an interruption of the plasma process, which is undesirable. On the other hand, if the threshold for arc detection is made too large to avoid these false arc detections, real arcs may be detected too late or not at all.

SUMMARY

One aspect of the present invention features methods of monitoring a discharge in a plasma process. The methods include the steps of:

a) supplying a plasma process with a periodic power supply signal;

b) determining a first power supply signal waveform within a first time interval within a first period of the power supply signal;

c) determining a second power supply signal waveform within a second time interval within a second period of the power supply signal, wherein the second time interval is at a position in the second period that corresponds to the position of the first time interval within the first period;

d) comparing the second power supply signal waveform of the second time interval with a reference signal waveform associated with the first power supply signal waveform of the first time interval, and determining a first comparison result, wherein the reference signal waveform can be the first power supply signal waveform itself or be generated from the first power supply signal waveform;

e) if the first comparison result corresponds to a given first comparison result, time-shifting one of the second power supply signal waveform in the second time interval and the reference signal waveform associated with the first power supply signal waveform in the first time interval to produce a time-shifted signal; and comparing the time-shifted signal with one of the signal waveforms that was not time-shifted, thereby obtaining a second comparison result.

Because the power supply signal is periodic, e.g., a sine waveform, the second time interval can have the same time interval for the second period as the first time interval for the first period. That is, a value within the second time interval in the second period has the same phase as a corresponding value at the same time within the first time interval in the first period. The values having the same phases in the first period of the first power supply signal waveform and in the second period of the second power supply signal waveform can be compared to determine the first comparison result.

One of the first and second comparison results may be obtained by determining a difference between the first and second power supply waveforms and determining if the difference is above or below a given reference value. Depending on whether an output current, an output voltage, or an output power is observed as the power supply signal, an arc is detected if the difference between the first and second power supply signal waveforms rises above or falls below a given reference value. Typically, the output voltage drops if an arc occurs and the output current increases if an arc occurs. Thus, by comparing the first and second power supply signal waveforms, in particular by detecting the difference between the first and second power supply signal waveforms, an arc may be detected.

The reference signal waveform may be the first power supply signal waveform in the first interval itself. Alternatively, the reference signal waveform may be determined by multiplying the first power supply signal waveform in the first interval with a given value or by adding or subtracting a constant value from the first power supply signal waveform in the first interval. If such a reference signal waveform is compared with the currently measured output signal waveform (that is, the second power supply signal waveform) and the currently measured output signal waveform intersects the reference signal waveform, this may be indicative of an arc having occurred.

Hence, one of the first or second comparison results may be obtained by monitoring if the second power supply signal waveform intersects the reference signal waveform.

A signal waveform can be time-shifted by moving the signal waveform along the time axis by a certain distance or an amount of time. The distance can be in a range between 1% and 20% of a length of a period of the signal waveform. The time-shifted version of the signal waveform and the non-time-shifted signal waveform can be sampled, digitized, and stored. The starting point for the sampling can be for example the beginning of a period.

In some cases, to compare two waveforms, corresponding samples of two waveforms are compared, for example, the first sample of the first waveform is compared with the first sample of the second waveform. If the first waveform is time-shifted and to be compared to the second waveform that is not time-shifted, the first sample of the time-shifted first waveform can be compared with for example the 20th sample of the non-time-shifted second waveform, second with $21^{st}$, and so on.

The signal waveform that has been time-shifted in step e) above may be time-shifted in the opposite direction and the time-shifted signal may be compared to one of the signal waveforms that were not time-shifted, thereby obtaining a third comparison result. In this way it is possible to detect arcs reliably when the output voltage is rising.

An arc detection signal may be generated if the first comparison result corresponds to the first given comparison result and at least one of the second or third comparison results corresponds to the second or third given comparison result respectively. Hence, an arc detection signal is generated only if the first comparison result has been confirmed by either the second or the third comparison result.

These methods allow safe and reliable arc detection. These methods lead to a more reliable arc detection because not only one comparison is performed but two comparisons are performed. False arc detection, for example due to a frequency jitter, can thus be avoided. The second comparison is used to confirm that the first comparison has detected a real arc.

Another aspect of the invention features monitoring devices that can be used for monitoring a discharge in a plasma process, which is supplied by a power supply signal. The monitoring devices include:

a) a first determining device arranged to determine a first power supply signal waveform within a first time interval within a first period of the power supply signal;

b) a second determining device arranged to determine a second power supply signal waveform within a second time interval within a second period of a power supply signal, wherein the second time interval is at a position in the second period that corresponds to the position of the first time interval within the first period;

c) a first comparator arranged to compare the second power supply signal waveform of the second time interval with the first power supply signal waveform of the first time interval or a reference signal waveform and to determine a first comparison result;

d) a first time-shifter arranged to time-shift one of the second power supply signal waveform in the second interval, the first power supply signal waveform in the first time interval, or the reference signal waveform; and e) a second comparator arranged to compare the time-shifted signal with one of the signal waveforms that were not time-shifted to determine a second comparison result.

Such monitoring devices allow fast and reliable detection of arcs in a plasma process.

At least one of the first and second comparators can include a subtracting device for subtracting one signal waveform from another signal waveform. The obtained difference indicates the presence of an arc, if it corresponds to a given comparison result, for example, if the difference is above or below a given reference value.

The monitoring device, e.g., the first comparator, can be configured to determine that no arc is present in the plasma process if the first comparison result does not correspond to a first given comparison result. The monitoring device, e.g., the second comparator and/or the first comparator, can be configured to determine that no arc is present in the plasma process if the first comparison result corresponds to the first given comparison result and the second comparison result does not correspond to a second given comparison result.

The monitoring device can include a reference signal waveform generator. In particular, the reference signal waveform generator can include a multiplier arranged to multiply a measured output signal waveform with a given value or, the reference signal waveform generator can include an adder or subtracter, which adds or subtracts a constant given value from a measured signal waveform.

A second time-shifter may be provided for time-shifting a signal waveform in the opposite direction compared to the time-shift performed by the first time-shifter. Thus, the comparison result achieved by the first comparator can be further confirmed.

A third comparator may be provided for comparing the output signal of the second time-shifter with a signal waveform that has not been time-shifted. This also serves for confirming the first comparison result.

An arc signal generator may be provided, which is connected to the first comparator and at least one of the second or third comparator. Thus, it can be ensured that an arc signal is generated only if the first comparison result obtained from the first comparator and a further comparison result obtained from the second or third comparator both indicate the presence of an arc.

A third aspect of the invention features plasma process systems including a power supply configured to supply power to a plasma process with a periodic power supply signal and a plasma discharge monitor for monitoring a discharge in the plasma process. The plasma discharge monitor includes the monitoring device as discussed above.

Note that the terms "arc," "arc discharge," and "discharge" are used interchangeably herein.

Further advantages and advantageous embodiments of the subject matter of the invention are more fully understood from the following description, the claims, and the drawings. Furthermore, the features described herein can be applied as such or severally in any desired combinations. The illustrated and described embodiments are not to be taken as a definitive list but, instead, are exemplary in nature for the depiction of the invention. The drawings show the subject matter of the invention in a very diagrammatic manner and are not to be regarded as being to scale.

DETAILED DESCRIPTION

Figure 1A:
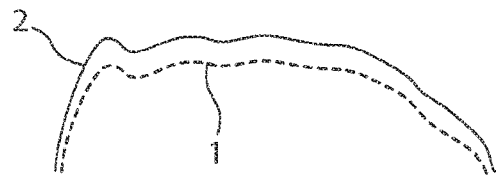
FIGS. 1A and 1B are diagrams showing examples of the comparison of a measured signal waveform with a reference signal waveform, in both cases not indicating the presence of an arc.

FIG. 1A shows a reference signal waveform 1 that has been determined by determining the signal waveform of a power supply signal, in this case the output voltage, in a previous period and by subtracting a constant value from the previously determined voltage waveform. The actual power supply signal, i.e., voltage 2, measured at the output of the power supply, is compared with the reference signal waveform 1. In FIG. 1A, no arc will be detected because the signal waveform 2 is identical to the previous signal waveform. Hence, there is always a difference between the two waveforms 1 and 2.

Figure 1B:

FIG. 1B shows the situation when the reference signal waveform 1' is generated by multiplying the previously determined power supply signal waveform with a constant factor. In this case, the actual power supply signal 2 gets very close to the reference signal waveform 1' at the beginning and the end of the reference signal waveform 1', however, it does not intersect the reference signal waveform 1'. Therefore, no arc is detected.

Figure 2A:
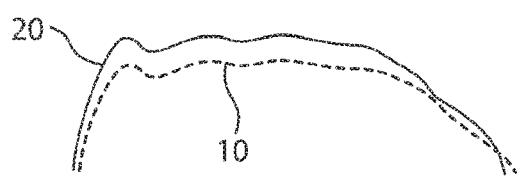
FIGS. 2A and 2B are diagrams showing examples of the comparison of a measured signal waveform and a reference signal waveform, wherein the measured signal waveform intersects the reference signal waveform, thus indicating the presence of an arc.
Figure 2B:
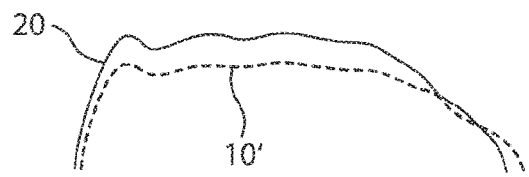

In the situation shown in FIGS. 2A and 2B the reference signal waveforms 10 and 10' have been determined in the same way as in FIGS. 1A and 1B. In this case, the actual power supply signal waveform 20 has very small frequency jitter. Therefore, in both cases the actual power supply signal waveform 20 falls below the reference signal waveform 10, 10'. This crossing of the two signal waveforms indicates an arc detection. However, no arc has occurred. This is called a false arc detection. The actual power supply signal waveform 20 only fell below the reference signal waveform 10, 10' because of the frequency jitter.

Figure 3A:
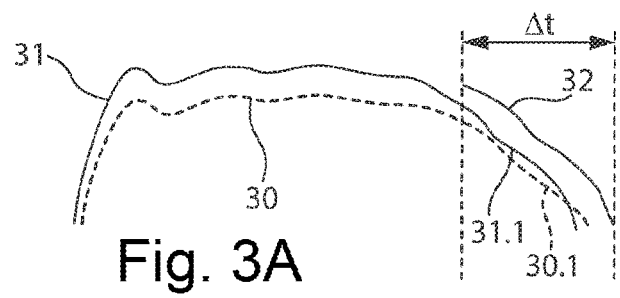
FIGS. 3A and 3B are diagrams showing examples of the comparison of a measured signal waveform with a reference signal waveform using the methods and systems described herein, which avoid false positive results when no actual arcs are present.

FIG. 3A shows a reference signal waveform 30 that has been obtained using the methods and systems described herein by determining a first power supply signal waveform within a first period of the power supply signal and then subtracting a constant value from the determined first power supply signal waveform. Furthermore, FIG. 3A shows a second power supply signal waveform 31 that has been determined in a second period of the power supply signal. The waveform 31 corresponds to an actual measured or determined power supply signal waveform. The part 30.1 of the power supply signal waveform 30 corresponds to a first power supply signal waveform that has been determined within a first time interval Δt within a first period of the power supply signal, wherein a constant value has been subtracted from the determined first power supply signal waveform to arrive at the reference signal waveform 30.1 in the interval Δt.

The part 31.1 of the waveform 31 corresponds to a second power supply signal waveform that has been determined within a second time interval Δt within a second period of a power supply signal, wherein the second time interval is at a position in the second period that corresponds to the position of the first time interval within the first period. Also, the time intervals chosen for the first and second period are of equal length in this example, which provides a preferred way of comparing the signal waveform 30.1 and 31.1 within the interval Δt. However, a person skilled in the art would understand that it is not essential that the first and the second intervals must be of equal length to compare both signal waveforms.

As can be seen in FIG. 3A, the signal waveform 31.1 intersects the reference signal waveform 30.1. Therefore, the first condition is met, which indicates the detection of an arc. To confirm whether an arc is indeed present, a time-shifting operation is performed on the signal waveform 31.1 within the interval Δt, e.g., to shift the signal waveform 31.1 within the interval Δt along the time axis by a distance (an amount of time or a given time). In some examples, the time-shifted distance is within a range between 1% and 20% of a length of a period of the signal waveform 31.1. The time-shifted signal waveform carries reference numeral 32. A second comparison is made, in particular, it is checked, whether the signal waveform 32 still intersects the reference signal waveform 30.1. In this example, this is not the case. Therefore, a second comparison result does not correspond with a given second comparison result. Hence, the first comparison result has not been confirmed, indicating that no arc is actually present and a false arc detection is avoided.

Figure 3B:
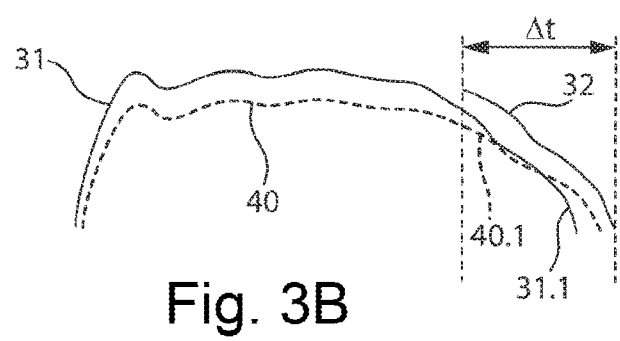

The situation shown in FIG. 3B corresponds to the situation shown in FIG. 3A. The only difference is that the reference signal waveform 40 has been obtained by multiplying a first power supply signal waveform determined in a first period of the power supply signal by a constant factor. In this case also the arc detection obtained by the first comparison, i.e., the signal 31.1 intersecting the reference signal waveform 40, is not confirmed by the time-shifted signal 32. Hence, no arc is detected and a false arc detection is avoided.

Note that the reference signal waveform 30 or 40 is associated with the first power supply signal waveform, e.g., generated based on the first power supply signal waveform. In some cases, the reference signal waveform is the first power supply signal waveform itself, and a first time interval of the first power supply signal waveform is directly compared to a corresponding second time interval of the second power supply signal waveform to determine a comparison result. In some cases, the reference signal waveform may be not associated with the first power supply signal waveform. For example, the reference signal waveform can be a standard waveform of the power supply signal.

Figure 4A:
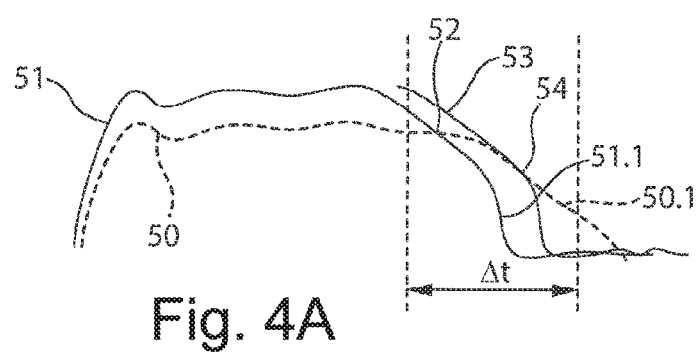
FIGS. 4A and 4B are diagrams showing examples of the comparison of a measured signal waveform with a reference signal waveform using the methods and systems described herein to reliably detect arcs.

In FIG. 4A the reference signal waveform 50 has been derived by measuring a first output signal waveform in a first period of the power supply signal and then subtracting a constant value, for example a constant voltage. Furthermore, a second power supply signal waveform 51 has been determined within a second period of the power supply signal. By comparing the signal waveforms 50 and 51 one can see that the second power supply signal waveform 51 intersects the reference signal waveform 50 at point 52. Hence, a first condition is met, which indicates the presence of an arc in the plasma. To confirm this, the second power supply signal waveform 51 has been time-shifted to arrive at the time-shifted signal waveform 53. This signal waveform 53 also intersects the reference signal waveform 50 at point 54. Therefore, a second given condition is reached and the occurrence of an arc is confirmed.

In the present example the time interval Δt has been selected around point 52. Therefore, signal waveform 51, in particular the part 51.1 that is within time interval Δt, had to be time-shifted. It would have been possible, to only determine the signals 50 and 51 in the time interval Δt and only compare the signal waveforms 51.1 and 50.1. On the other hand, the time interval Δt could have been chosen to be the entire period of the power supply signal or half a period of the power supply signal. In particular, the signals 50 and 51 could be determined only in corresponding time intervals Δt for two different periods of the power supply signal.

Figure 4B:
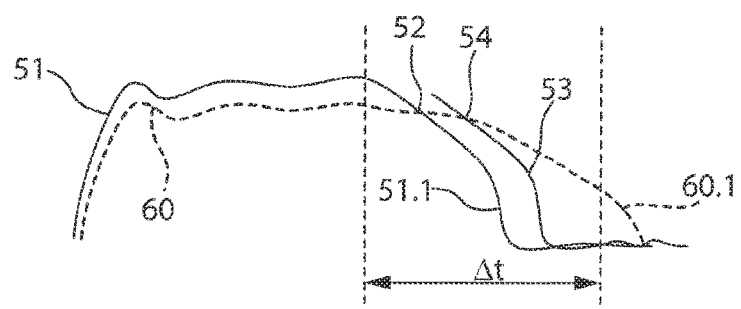

FIG. 4B essentially corresponds to FIG. 4A. The only difference is that the reference signal waveform 60 has been determined by first determining a first power supply signal waveform within a first time interval within a first period of the power supply signal and then multiplying the determined power supply signal waveform with a constant factor. From FIG. 4B it is clear that the time interval Δt has been chosen large enough to make sure that an arc can be detected. Preferably, the time interval Δt corresponds to at least half a period of the power supply signal.

Figure 5:
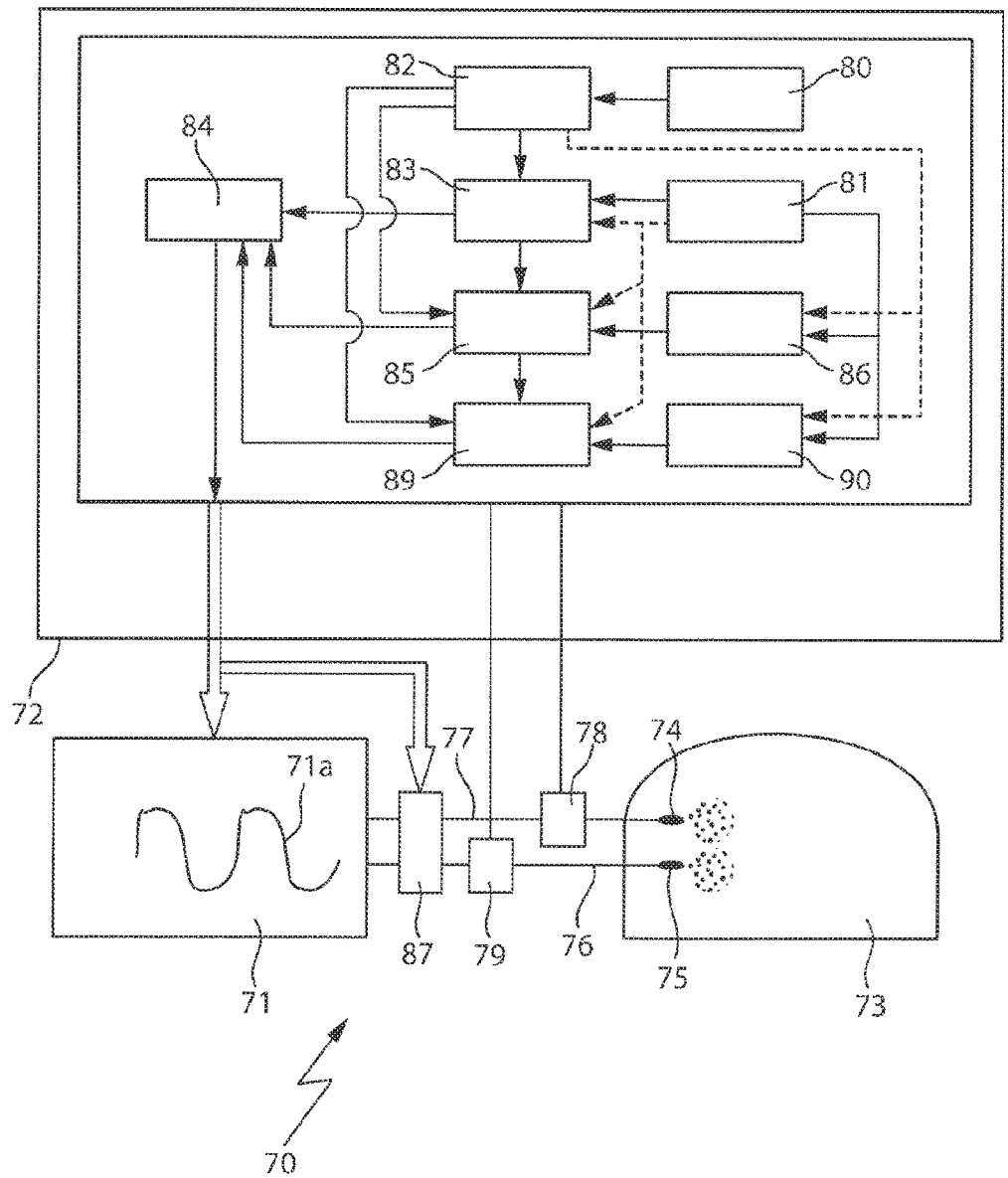
FIG. 5 is a schematic of an example of a plasma process system including a monitoring device as described herein.

FIG. 5 shows a plasma process system 70 having a power supply 71 and a monitoring device 72. The power supply 71 supplies power to a plasma process within a plasma chamber 73. The power supply 71 generates a power supply signal 71a which is transmitted to the electrodes 74, 75 within the plasma chamber 73 via lines 76, 77. The power supply 71 may be an MF generator, in particular a freely oscillating MF generator. In that case, the power supply 71 produces an AC signal with positive and negative half wave. In the preferred alternative, the power supply 71 may be a bipolar pulsed generator. In that case, the positive or negative half wave may be adjusted individually.

The power supply signal may be measured via measuring means 78, 79, e.g., a directional coupler, a voltage sensor, or a current sensor. A first determining device 80, e.g., a logic unit or a field-programmable gate array (FPGA), is provided for determining a first power supply signal waveform within a first time interval within a first period of the power supply signal. Furthermore, a second determining device 81, e.g., a logic unit or an FPGA, is provided for determining a second power supply signal waveform within a second time interval within a second period of the power supply signal, wherein the second time interval is at a position in the second period with corresponds to the position of the first time interval within the first period. In one embodiment, the first power supply signal waveform and the second power supply signal waveform are both measured with one measuring means.

The first determining device 80 is connected to a reference signal generator 82, which produces a reference signal waveform. The reference signal waveform is supplied to a first comparator 83 as well as the power supply waveform determined by the second determining device 81. If a predefined comparison result is obtained, a signal is supplied to an arc signal generator 84. For example, a signal is supplied to the arc signal generator 84, if the power supply signal waveform determined by the second determining device 81 intersects the reference signal waveform produced in the reference signal generator 82.

The reference signal waveform produced by reference signal generator 82 is also supplied to a second comparator 85, as well as the signal produced by a first time-shifter 86. The first time-shifter 86 shifts the power supply signal waveform which has been determined by the second determining device 81. It is possible to time-shift the entire determined power supply signal waveform or only that part of the power supply signal waveform that lies in the second interval. In particular, the interval may be chosen dependent on the point where one signal waveform interests the other. If a given second comparison result is reached by a second comparator 85, a signal is supplied to the arc signal generator 84. The arc signal generator 84 has now received a signal from the first comparator 83 and the second comparator 85. Therefore, the arc signal generator 84 produces an arc detection signal, which is fed to the power supply 71 as well as an arc extinction device 87, e.g., a switch, a capacitor, or a diode. In that way, the power supply 71 and the substrate processed in the plasma process can be protected from damage.

As can be seen from FIG. 5, a third comparator 89 may be provided, which is also supplied with the reference signal produced by the reference signal generator 82 and the signal from the second time-shifter 90, which time-shifts the power supply signal waveform determined by the second determining device 81. However, in this case the time-shift is performed in the opposite direction to the time-shift produced by the first time-shifter 86. If the third comparator 89 detects that a third given comparison result is reached, a signal is given to the arc signal generator 84. The arc signal generator 84 can produce an arc detection signal depending on the signals received from the first, second, and/or third comparator 83, 85, 89.

As an alternative to time-shifting the power supply signal waveform determined by the second determining device 81 according to this invention it is also possible to time-shift the reference signal waveform produced in the reference signal generator 82 with first and second time-shifter 86, 90. The second determining device 81 is then connected to first, second and third comparators 83, 85, 89. In that case the power supply signal waveform determined by the second determining device 81 is compared with the reference signal waveform and the time-shifted reference signal waveforms generated by first and second time-shifter 86, 90 respectively. This alternative is outlined in FIG. 5 with dashed lines.

The monitoring device 72 may also be part of the power supply 71. Also the extinction device 87 may be part of the power supply 71. Also measuring means 78, 79 may be part of the power supply 71. The monitoring device 72 as a whole or at least partly may be incorporated in a microcontroller, or digital signal processor or in particular in a programmable digital logic device (PLD). This PLD may be a field programmable gate array (FPGA). With such devices an arc may be detected extremely quickly and reliably.

Figure 6:
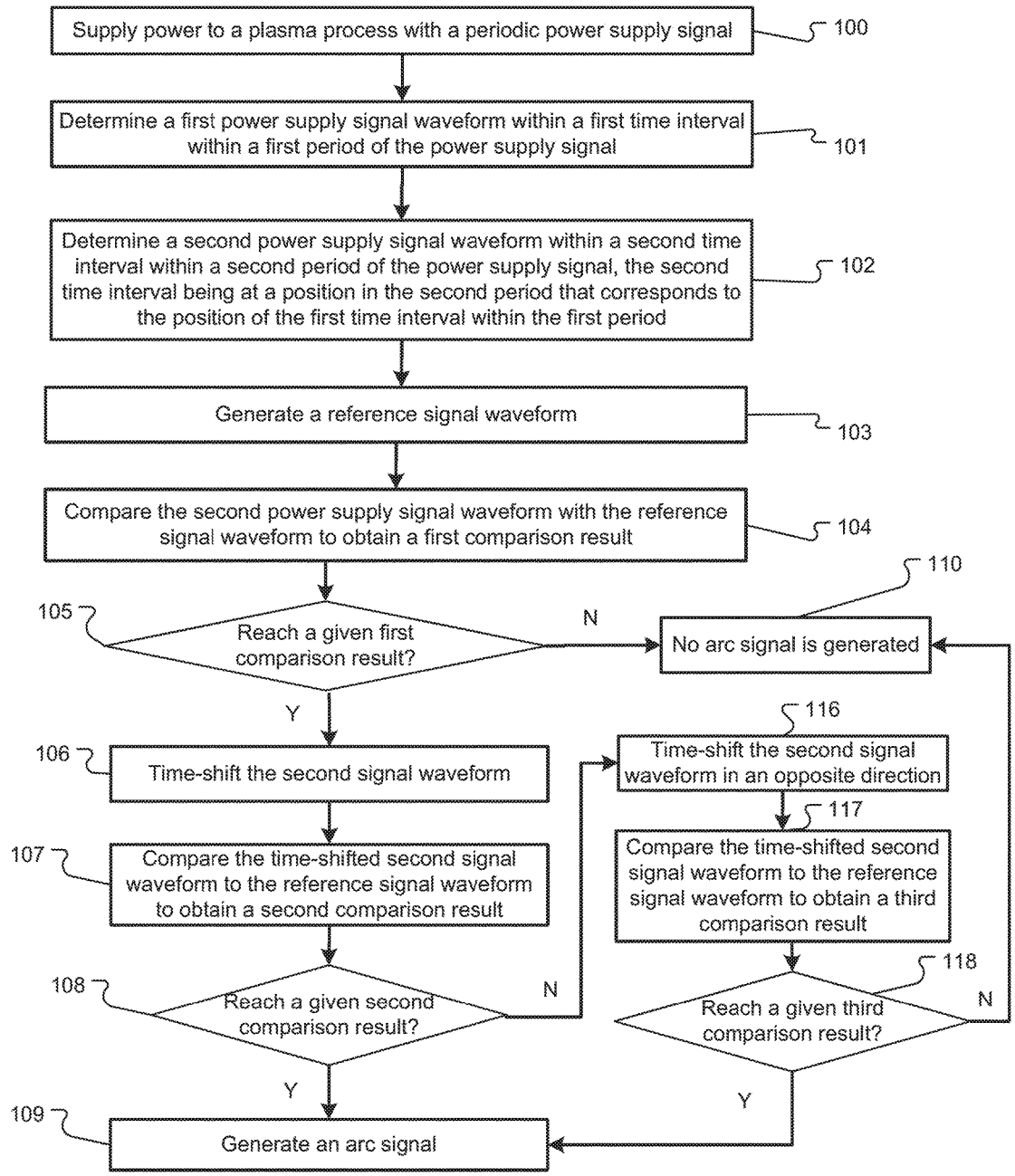
FIG. 6 is a flow chart showing an example of a process of monitoring discharge in a plasma process.

FIG. 6 shows a flow chart to illustrate the inventive methods. In step 100 power is supplied to a plasma process by means of a power supply signal. In step 101 a power supply signal waveform is determined within a first time interval within a first period of the power supply signal. In step 102 a second power supply signal waveform is determined within a second time interval within a second period of the power supply signal, wherein the second time interval is at a position in the second period which corresponds to the position of the first time interval within the first period. The first time interval and the second time interval can have an identical length.

In step 103 a reference signal waveform is generated. For example, the reference signal waveform can be produced from the power supply signal waveform determined in step 101. In step 104 the power supply signal waveform determined in step 102 is compared with the reference signal waveform to obtain a first comparison result. In step 105 it is checked if a given first comparison result is reached. If that is the case, in step 106 the power supply signal waveform determined in step 102 is time-shifted. If that is not the case, no arc signal is generated in step 110. In step 107, which follows step 106, the time-shifted signal is compared to the reference signal waveform to obtain a second comparison result. In step 108 it is checked if a second given comparison result is reached. If that is the case, an arc signal is generated in step 109. If that is not the case, in step 116 the power supply signal waveform determined in step 102 may be time-shifted in the other direction, e.g., an opposite direction. In step 117 the time-shifted signal may be compared to the reference signal waveform to obtain a third comparison result. In step 118 it may be checked if a third given comparison result is reached. If that is the case, an arc signal is generated in step 109. If that is not the case, no arc signal is generated in step 110.

As disclosed earlier it is as an alternative also possible to time-shift the reference signal waveform in steps 106, 116. The power supply signal waveform is then compared with the time-shifted reference signal waveforms in steps 107, 117.

Other Embodiments

A number of embodiments of the invention have been described. Nevertheless, it will be understood that various modifications may be made without departing from the spirit and scope of the invention. Accordingly, other embodiments are within the scope of the following claims.

What is claimed is:

1. A method of monitoring a discharge in a plasma process, the method comprising:
 supplying a plasma process with a periodic power supply signal;
 determining a first power supply signal waveform in a first time interval within a first period of the power supply signal;
 determining a second power supply signal waveform in a second time interval within a second period of the power supply signal, wherein the second time interval is at a position within the second period corresponding to a position of the first time interval within the first period;
 comparing the second power supply signal waveform of the second time interval with a reference signal waveform associated with the first power supply signal waveform of the first time interval to thereby obtain a first comparison result;
 if the first comparison result corresponds to a given first comparison result, time-shifting one of the second power supply signal waveform and the reference signal waveform, and comparing the time-shifted signal waveform with the other one of the second power supply signal waveform and the reference signal waveform that was not time-shifted to thereby obtain a second comparison result; and
 generating an arc detection signal indicating an arc is present in the plasma process if the first comparison result corresponds to the first given comparison result and the second comparison result corresponds to a second given comparison result, respectively.

2. The method of claim 1, further comprising:
 determining that no arc is present in the plasma process if the first comparison result corresponds to the first given comparison result and the second comparison result does not correspond to a second given comparison result.

3. The method of claim 1, wherein obtaining the first comparison result comprises:
 determining a difference between the second power supply waveform and the reference signal waveform; and
 determining if the difference is above or below a given reference value.

4. The method of claim 1, wherein obtaining the second comparison result comprises:
 determining a difference between the time-shifted signal waveform and the other signal waveform that was not time-shifted; and
 determining if the difference is above or below a given reference value.

5. The method of claim 1, wherein obtaining the first comparison result comprises monitoring if the second signal waveform intersects the reference signal waveform.

6. The method of claim 1, wherein obtaining the second comparison result comprises monitoring if the time-shifted signal waveform intersects the other signal waveform that was not time-shifted.

7. A method of monitoring a discharge in a plasma process, the method comprising:
 supplying a plasma process with a periodic power supply signal;
 determining a first power supply signal waveform in a first time interval within a first period of the power supply signal;
 determining a second power supply signal waveform in a second time interval within a second period of the power supply signal, wherein the second time interval is at a position within the second period corresponding to a position of the first time interval within the first period;
 comparing the second power supply signal waveform of the second time interval with a reference signal waveform associated with the first power supply signal waveform of the first time interval to thereby obtain a first comparison result;
 if the first comparison result corresponds to a given first comparison result, time-shifting one of the second power supply signal waveform and the reference signal waveform in a first direction, and comparing the time-shifted signal waveform with the other one of the second power supply signal waveform and the reference signal waveform that was not time-shifted to thereby obtain a second comparison result;
 time-shifting the signal waveform that was time-shifted in a second direction opposite to the first direction; and
 comparing the time-shifted signal waveform in the second direction to the other signal waveform that was not time-shifted to thereby obtain a third comparison result.

8. The method of claim 7, further comprising:
 generating an arc detection signal indicating that an arc is present in the plasma process if the first comparison result corresponds to the first given comparison result and at least one of the second comparison result or the third comparison result corresponds to a second given comparison result or a third given comparison result, respectively.

9. A method of monitoring a discharge in a plasma process, the method comprising:
 supplying a plasma process with a periodic power supply signal;
 determining a first power supply signal waveform in a first time interval within a first period of the power supply signal;
 determining a second power supply signal waveform in a second time interval within a second period of the power supply signal, wherein the second time interval is at a position within the second period corresponding to a position of the first time interval within the first period;
 comparing the second power supply signal waveform of the second time interval with a reference signal waveform associated with the first power supply signal waveform of the first time interval to thereby obtain a first comparison result;

if the first comparison result corresponds to a given first comparison result, time-shifting one of the second power supply signal waveform and the reference signal waveform, and comparing the time-shifted signal waveform with the other one of the second power supply signal waveform and the reference signal waveform that was not time-shifted to thereby obtain a second comparison result; and determining the reference signal waveform by one of:

multiplying the first power supply signal waveform in the first interval with a given value, and adding or subtracting a constant value from the first power supply signal waveform in the first interval.

10. A monitoring device for monitoring a discharge in a plasma process supplied by a power supply signal, comprising:

a first determining device arranged to determine a first power supply signal waveform within a first time interval within a first period of the power supply signal;

a second determining device arranged to determine a second power supply signal waveform within a second time interval within a second period of the power supply signal, wherein the second time interval is at a position in the second period corresponding to a position of the first time interval within the first period;

a first comparator arranged to compare the second power supply signal waveform of the second time interval with a reference signal waveform associated with the first power supply signal waveform of the first time interval and determining a first comparison result;

a first time-shifter arranged to time-shift one of the second power supply signal waveform and the reference signal waveform; and a second comparator arranged to compare the time-shifted signal with the other one of the second power supply signal waveform and the reference signal waveform that was not time-shifted and determining a second comparison result.

11. The monitoring device of claim 10, further comprising an arc signal generator connected to the first comparator and the second comparator.

12. The monitoring device of claim 11, wherein the arc signal generator is configured to generate an arc detection signal indicating that an arc is present in the plasma process if the first comparison result corresponds to a first given comparison result and the second comparison result corresponds to a second given comparison result, respectively.

13. The monitoring device of claim 10, where at least one of the first comparator or the second comparator is configured to:

determine that no arc is present in the plasma process if the first comparison result does not correspond to a first given comparison result; and determine that no arc is present in the plasma process if the first comparison result corresponds to the first given comparison result and the second comparison result does not correspond to a second given comparison result.

14. The monitoring device of claim 10, wherein at least one of the first and second comparator comprises a subtracting device for subtracting one signal waveform from another signal waveform.

15. The monitoring device of claim 10, further comprising a reference signal waveform generator arranged to generate the reference signal waveform based on the first power supply signal waveform of the first time interval.

16. The monitoring device of claim 10, further comprising a second time-shifter arranged to time-shift a signal waveform in an opposite direction compared to the time-shift performed by the first time-shifter.

17. The monitoring device of claim 16, further comprising a third comparator for comparing an output signal of the second time-shifter with another signal waveform that has not been time-shifted and determining a third comparison result.

18. The monitoring device of claim 17, further comprising an arc signal generator connected to the first comparator and at least one of the second comparator or the third comparator and configured to generate an arc detection signal indicating that an arc is present in the plasma process if the first comparison result corresponds to the first given comparison result and at least one of the second comparison result or the third comparison result corresponds to a second given comparison result or a third given comparison result, respectively.

19. A plasma process system comprising:

a power supply configured to supply power to a plasma process with a periodic power supply signal; and a plasma discharge monitor configured to monitor a discharge in the plasma process, comprising:

a first determining device configured to determine a first power supply signal waveform within a first time interval within a first period of the power supply signal;

a second determining device configured to determine a second power supply signal waveform within a second time interval within a second period of the power supply signal, wherein the second time interval is at a position in the second period that corresponds to a position of the first time interval within the first period;

a first comparator configured to compare the second power supply signal waveform of the second time interval with a reference signal waveform associated with the first power supply signal waveform of the first time interval and determining a first comparison result;

a first time-shifter configured to time-shift one of the second power supply signal waveform and the reference signal waveform; and a second comparator configured to compare the time-shifted signal with the other one of the second power supply signal waveform and the reference signal waveform that was not time-shifted and determining a second comparison result.

* * * * *